(12) United States Patent
Imagawa et al.

(10) Patent No.: US 6,774,680 B2
(45) Date of Patent: Aug. 10, 2004

(54) COMPARATOR INCLUDING A DIFFERENTIAL TRANSISTOR PAIR AND A DIODE ARRANGEMENT

(75) Inventors: Kengo Imagawa, Fujisawa (JP); Norio Chujo, Tokyo (JP); Kaoru Arita, Yokohama (JP); Yoshiharu Umemura, Fujisawa (JP); Masahiro Imanari, Akeno (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/379,540

(22) Filed: Mar. 6, 2003

(65) Prior Publication Data

US 2003/0222681 A1 Dec. 4, 2003

(30) Foreign Application Priority Data

May 29, 2002 (JP) ......................................... 2002-154837

(51) Int. Cl.⁷ ................................................ H03K 5/22
(52) U.S. Cl. ............................... 327/77; 327/56; 327/61
(58) Field of Search .............................. 327/59, 88, 52, 327/56, 61, 77

(56) References Cited

U.S. PATENT DOCUMENTS 3,924,159 A * 12/1975 Hoover ........................ 361/101
4,323,854 A * 4/1982 Hester ......................... 330/256
4,461,962 A * 7/1984 Hacke et al. ................. 327/175
4,629,911 A * 12/1986 Bebernes et al. .............. 327/85
4,791,313 A * 12/1988 Kuo et al. .................... 327/109
5,184,089 A * 2/1993 Van Gorsel .................. 330/254
5,563,534 A * 10/1996 Rossi et al. .................... 327/77
6,166,659 A * 12/2000 Kusano ........................ 340/928

FOREIGN PATENT DOCUMENTS

| JP | 61-266962 | 11/1986 |
| JP | 02-069016 | 3/1990 |
| JP | 06-308170 | 11/1994 |
| JP | 2000-088893 | 3/2000 |
| JP | 2000-0829422 | 3/2000 |
| JP | 2000-121678 | 4/2000 |
| JP | 2000-304805 | 11/2000 |

* cited by examiner

*Primary Examiner*—Timothy P. Callahan
*Assistant Examiner*—An T. Luu
(74) *Attorney, Agent, or Firm*—Antonelli, Terry, Stout & Kraus, LLP

(57) ABSTRACT

A comparator is provided with a pair of transistors which are continuously in ON state, in which a switch unit constructed of a diode pair, for switching a current path in response to a high/low relationship between a voltage level of an input signal and a voltage level of a reference voltage, and a unit for converting a current into a voltage level are provided between emitter terminals of the transistor pair.

18 Claims, 13 Drawing Sheets

VOLTAGE $V_{BE}$ OF
TRANSISTOR 1N

VOLTAGE $V_{BE}$ OF
TRANSISTOR 2N

VOLTAGE $V_F$ OF
DIODE 3

VOLTAGE $V_F$ OF
DIODE 4

VOLTAGE $V_{BE}$ OF
TRANSISTOR 1N

VOLTAGE $V_{BE}$ OF
TRANSISTOR 2N

VOLTAGE $V_{BE}$ OF TRANSISTOR 1N

VOLTAGE $V_{BE}$ OF TRANSISTOR 2N

COMPARATOR INCLUDING A DIFFERENTIAL TRANSISTOR PAIR AND A DIODE ARRANGEMENT

BACKGROUND OF THE INVENTION

The present invention relates to a comparator for comparing an input signal with a reference voltage. More specifically, the present invention is directed to a comparator for comparing an analog signal having a wide range of an input voltage, to a LSI test system for testing electric characteristics of an IC, and also to an apparatus which requires a comparison/judgement of voltage levels.

Conventionally, in this sort of the comparator, an allowable input voltage range for an input signal relative to a reference voltage is determined based upon a breakdown voltage $V_{EBO}$ between a base and an emitter of a differential transistor pair (namely, reverse-voltage application range of $V_{BE}$). When a reverse voltage applied across a base and an emitter of a transistor is increased, a current amplification factor $h_{FE}$ is lowered. In general, a reverse voltage between a base and an emitter of a bipolar transistor under which no reduction of a current amplification factor $h_{FE}$ is caused, is on the order of about 2 to 3 V, namely low voltage. A maximum voltage which can be applied across a base and an emitter of a transistor without lowing the factor $h_{FE}$ will be referred to as a base-emitter reverse withstanding voltage $V_R$ hereinafter.

In other words, an input voltage range which does not deteriorate characteristics of a comparator circuit is determined by the base-emitter reverse withstanding voltage $V_R$ of a transistor, and thus, there is such a problem that a voltage difference across an input table input voltage and a reference voltage is small.

FIG. 4 indicates an example of the most generic differential type comparator circuit with employment of a differential transistor pair. An input signal Vin is inputted to an input terminal 20, and a reference voltage Vref is entered to another input terminal 21 of this differential type comparator circuit. Both a transistor 1N and another transistor 2N are turned ON/OFF in response to a high/low relationship of voltage levels of the input signal Vin and the reference voltage Vref. A current I0 of a current source 6 flows through either a resistor 8 or a resistor 9, thereby producing a voltage drop and thus outputting a comparison judgement level (H/L) to output terminals 22 and 23.

FIG. 5A to FIG. 5C represent conditions of changes in base-emitter voltages $V_{BE}$ of the transistors 1N and 2N in such a case that an input signal Vin 20 is changed with time, and is compared with a certain reference voltage Vref 21. Until the present time reaches time $t_1$ (in case of input signal Vin 20<reference voltage Vref 21), the transistor 1N is turned OFF and the transistor 2N is turned ON. When the present time exceeds the time $t_1$ (in case that input signal Vin 20>reference voltage Vref 21), the transistor 1N is turned ON and the transistor 2N is turned OFF. As to a reverse voltage applied across a base and an emitter of a transistor set under OFF state, assuming now that a voltage across a base and an emitter of such a transistor set under ON state is equal to $V_{BE(ON)}$, a voltage of input signal Vin 20−reference voltage Vref 21−$V_{BE(ON)}$ is applied. If the ON-voltage $V_{BE(ON)}$ between the base and the emitter is neglected, then a difference between the input signal Vin 20 and the reference voltage Vref 21 is applied as the reverse voltage across the base and the emitter of the transistor set to the OFF state (see 91 of FIG. 5B and 92 of FIG. 5C).

While a base-emitter reverse withstanding voltage $V_R$ of a bipolar transistor is about 2 to 3 V, namely a low voltage, an input voltage range which does not deteriorate the characteristic of the comparator is determined based upon the reverse withstanding voltages $V_R$ of the transistors 1N and 2N. As a result, there is such a drawback that the input signal can be compared with the reference voltage only when a difference between the input signal and the reference voltage is 2 to 3 V in maximum.

Conventionally, JP-A-2-69016 has described a technique of such a comparator for aiming an enlargement of a voltage range for an input signal. FIG. 6 shows a similar circuit diagram to this conventional comparator. In this comparator circuit, a voltage dividing circuit 37 constituted by a plurality of resistors is inserted into a prestage of a comparator 103. FIG. 7A to FIG. 7D show voltage levels Vin' 200, and Vref' 211 inputted to the comparator 103, and conditions of changes in voltages $V_{BE}$ applied across the bases and the emitters of the transistors 1N and 2N in the case that the input signal Vin 20 is changed with time, and is compared with a certain constant reference voltage Vref 21. As indicated in FIG. 7B, as the voltages Vin' 200 and Vref' 211 inputted to the comparator 103, such voltages are entered which are produced by reducing the original input signal Vin 20 and the original reference voltage Vref 21 by a resistance ratio (voltage dividing ratio) of the voltage dividing circuit 37 provided at the prestage of this comparator 103. Since the resistor values of the voltage dividing circuit 37 are determined in such a manner that the resistor values do not exceed reverse withstanding voltages $V_R$ between the bases and the emitters of the transistors 1N and 2N in consideration of the input voltage range of the input signal Vin and the reference voltage Vref, the enlargement of the input voltage range is realized.

With the arrangement of the voltage dividing circuit 37 at the prestage of the comparator 103, however, a low-pass filter (LPF) is undesirably constituted by stray capacitances of both the transistors 1N and 2N, and both the resistors 95 and 96 of the voltage dividing circuit 37. As a consequence, there is such a problem that high frequency components of the input signal are cut off by the low-pass filter LPF, and thus, the input band width of the comparator 103 is restricted.

SUMMARY OF THE INVENTION

The present invention has been made to solve the above-described problems, and therefore, has an object to provide a comparator capable of enlarging a voltage range of an input signal, and capable of directly comparing/judging a voltage level of the input signal with respect to a voltage level of a reference voltage.

Another object of the present invention is to provide a comparator which is especially suitable for a LSI test system for testing ICs.

To achieve the above-described objects, typical inventive comparators among comparators according to the present invention are as follows:

According to one aspect of the invention, a comparator is comprised of: a pair of transistors which are continuously brought into ON states; wherein: switch means constructed of a diode pair, for switching a current path in response to a high/low relationship between a voltage level of an input signal and a voltage level of a reference voltage; and means for converting the current into a voltage level are provided between emitter terminals of the transistor pair.

According to another aspect of the invention, a comparator is comprised of: an input terminal having a diode; a differential transistor pair in which the transistors are turned ON/OFF in response to a high/low relationship between a voltage level of an input signal and a voltage level of a reference voltage; a circuit constituted by a diode between base terminals of the differential transistor pair; and means for converting the current which is switched by the differential transistor pair into a voltage level.

According to still another of aspect of the invention, a comparator is comprised of: a differential transistor pair which is turned ON/OFF in response to a high/low relationship between a voltage level of an input signal and a voltage level of a reference voltage; diodes each provided at the emitter terminal of the differential transistor pair and diodes each provided between the emitter and the base of the differential transistor pair; and means for converting a current which is switched by the differential transistor pair into a voltage level.

According to still further aspect of the invention, a comparator is comprised of: a diode bridge circuit provided at an one input terminal; a differential transistor pair which is turned ON/OFF in response to a high/low relationship between a voltage level of an input signal and a voltage level of a reference voltage; a push-pull circuit provided between base terminals of the differential transistor pair; and means for converting a current which is switched by the differential transistor pair into a voltage level.

Other objects, features and advantages of the invention will become apparent from the following description of the embodiments of the invention taken in conjunction with the accompanying drawings.

DESCRIPTION OF THE EMBODIMENTS

Referring now to accompanying drawings, various embodiments according to the present invention will be described in a concrete manner. However, the present invention is not limited to these embodiments.

Figure 1:
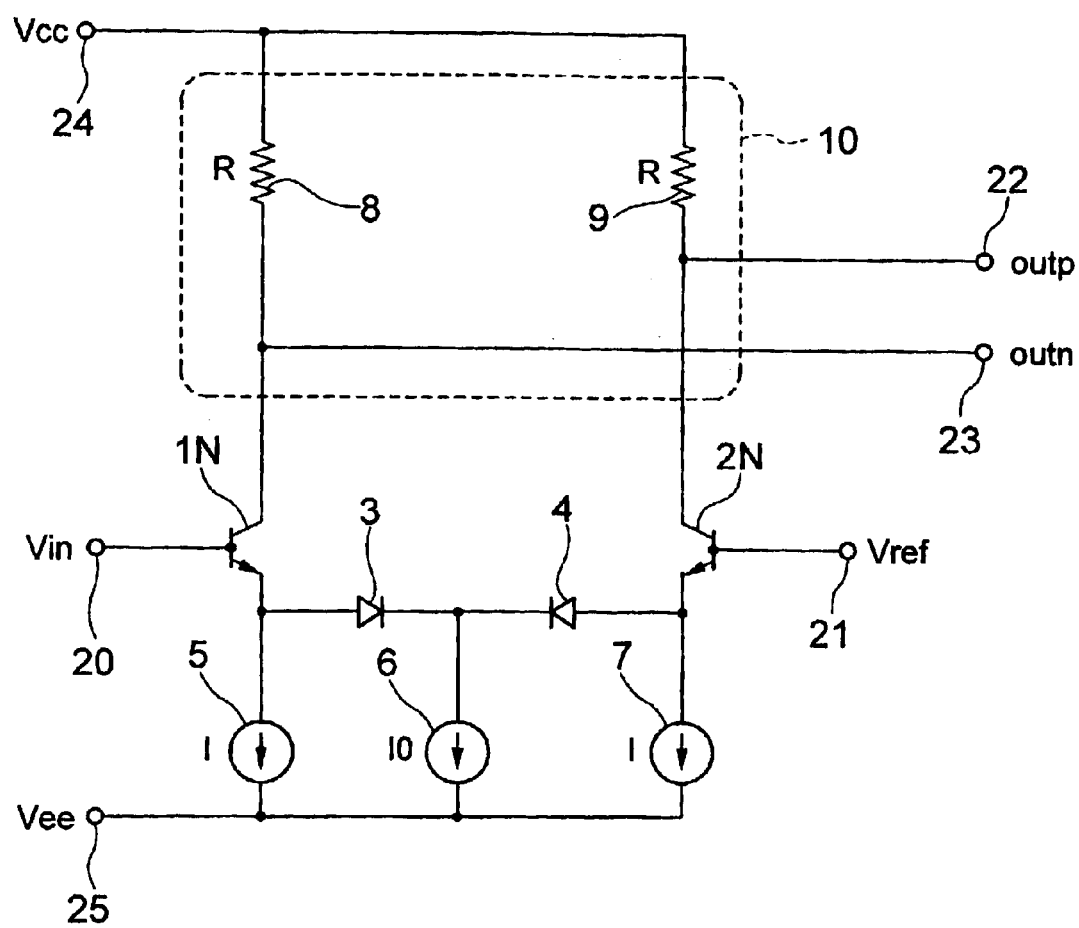
FIG. 1 is a circuit diagram of a comparator circuit according to an embodiment of the present invention.
Figure 2A:
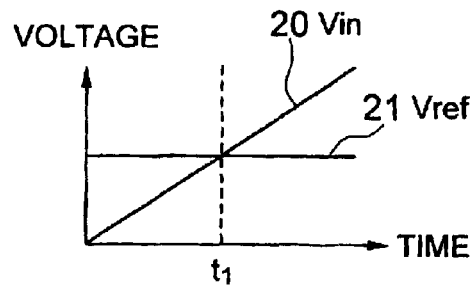
FIG. 2A to FIG. 2E are diagrams for indicating operations of the comparator circuit shown in FIG. 1.
Figure 2B:
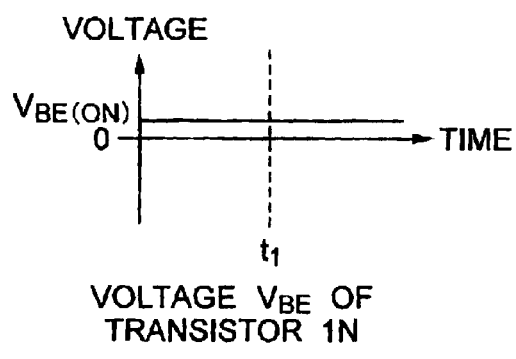
Figure 2C:
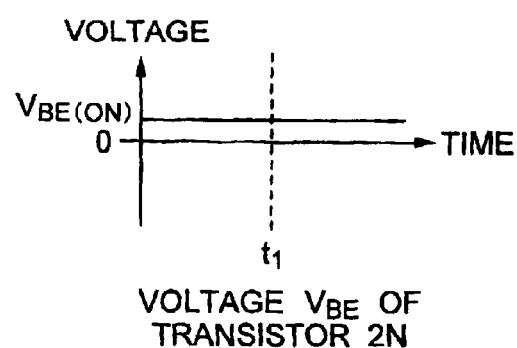

FIG. 1 is a circuit diagram for showing a comparator circuit according to an embodiment of the present invention. This comparator circuit is constituted by transistors 1N and 2N into which an input signal Vin 20 and a reference voltage Vref 21 are inputted, respectively; diodes 3 and 4; current sources 5, 6, and 7; and also, a current-to-voltage converting circuit 10. The current-to-voltage converting circuit 10 is constituted by a resistor 8 and another resistor 9. FIGS. 2A to FIG. 2E represent conditions of changes in voltages applied across bases and emitters of the transistors 1N and 2N, and also conditions of changes in voltages applied to the diodes 3 and 4 in such a case that the input signal Vin 20 is changed with time and is compared with a certain constant reference voltage Vref 21. Since the transistors 1N and 2N are continuously brought into ON-state by the current sources 5 and 7, as shown in FIG. 2B and FIG. 2C, base-to-emitter voltages $V_{BE}$ of these transistors 1N and 2N are ON-voltages $V_{BE(ON)}$ and are always constant.

Until the present time reaches time $t_1$ of FIG. 2, in such a case that input signal Vin 20<reference voltage Vref 21, the diode 3 is turned OFF, the diode 4 is in an ON-state, and a current I flows through the resistor 8, and another current I+I0 flows through the resistor 9. A voltage outp=Vcc−I×R is outputted to an output terminal 22, and another voltage outn=Vcc−(I+I0)×R is outputted to another output terminal 23. Since the output voltages are outp 22<outn 23, such a judgement can be made of input signal Vin<reference voltage Vref.

In the case that the present time exceeds the time $t_1$ and input signal Vin 20>reference Vref 21, the diode 3 is now turned OFF, and the diode 4 is brought into an ON-state, a path through which the current I0 flows is changed, and then, the output voltage becomes outp 22>outn 23.

Since the voltage levels of the output terminals 22 and 23 are determined based upon the current values I and I0 of the current sources 5, 7, and 6, and also resistance values R of the resistors 8 and 9, these voltage levels become either constant high (H) levels or constant low (L) levels.

Figure 2D:
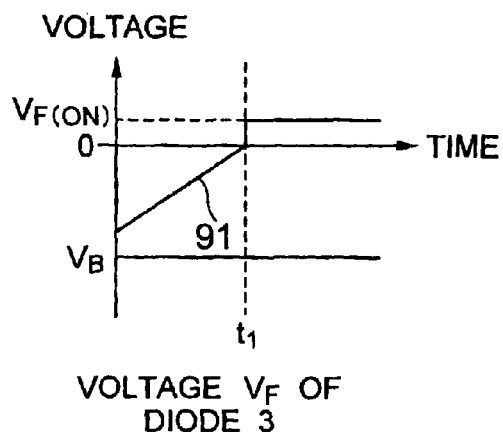
Figure 2E:
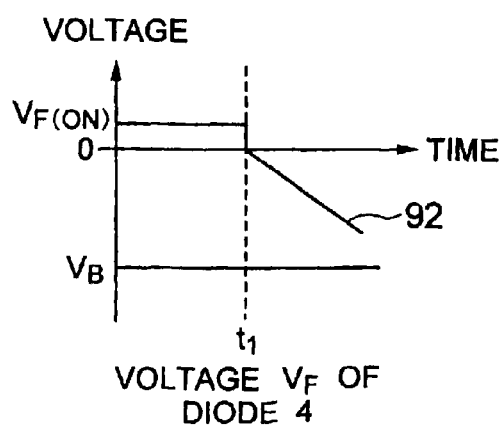
Figure 5A:
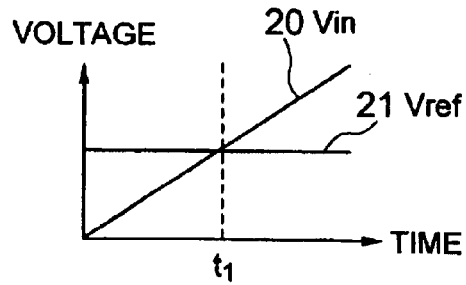
FIG. 5A to FIG. 5C are diagrams for representing the operations of the conventional comparator circuit of FIG. 4.
Figure 5B:
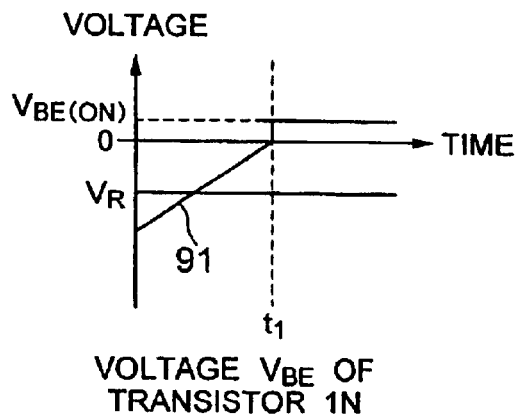
Figure 5C:
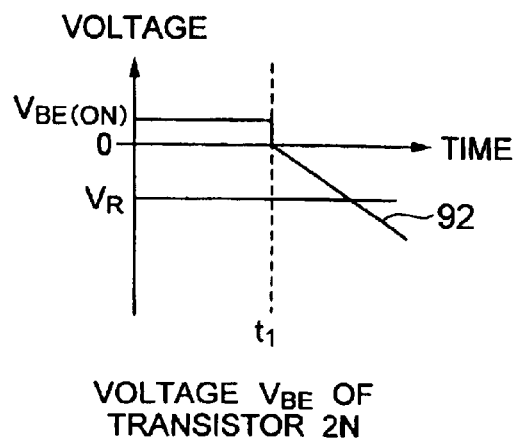
Figure 6:
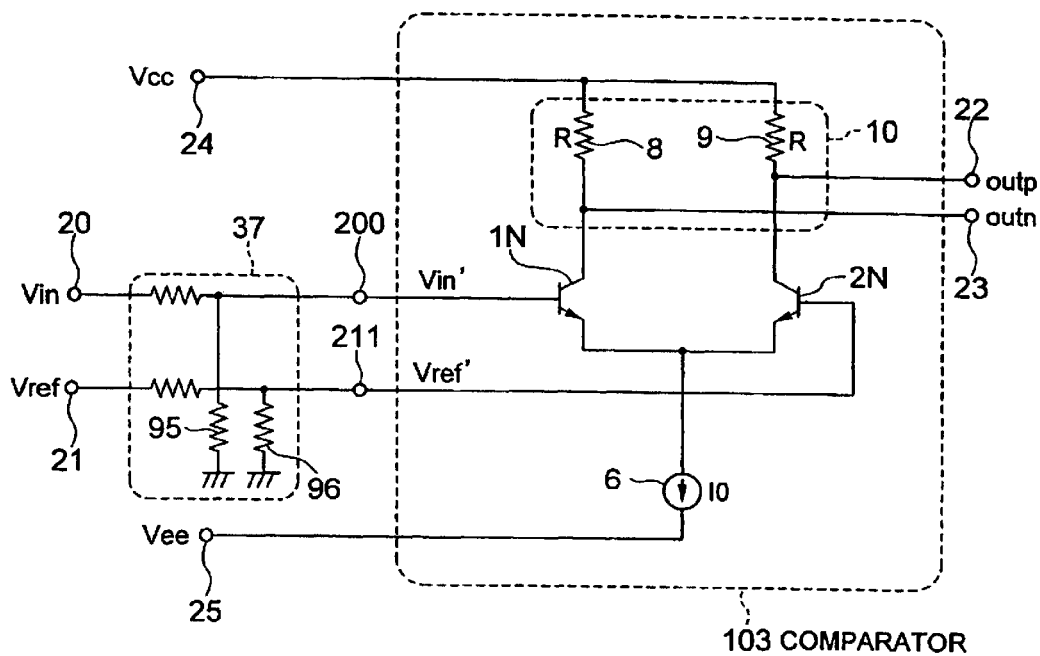
FIG. 6 is the circuit diagram of another conventional comparator circuit.
Figure 7A:
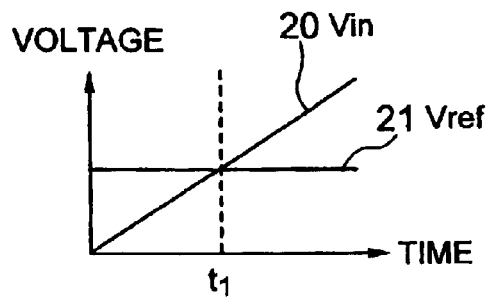
FIG. 7A to FIG. 7D are diagrams for showing the operations of the conventional comparator circuit of FIG. 6.
Figure 7B:
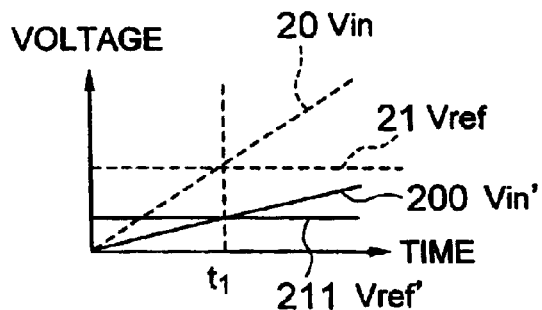
Figure 7C:
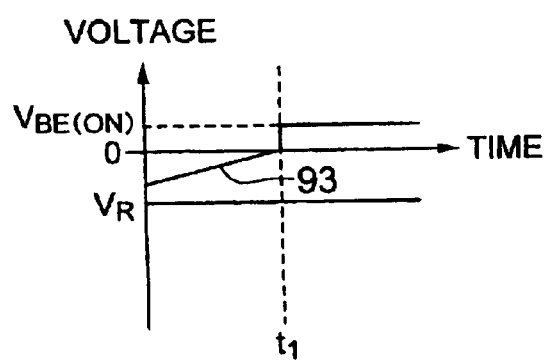
Figure 7D:
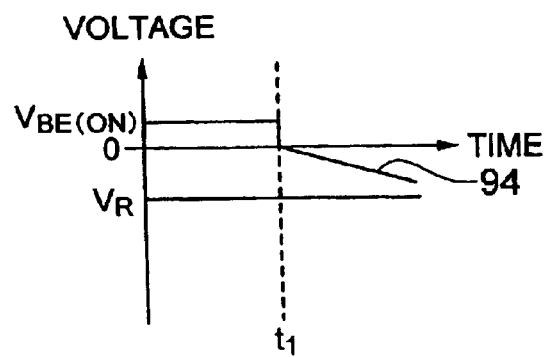

In the embodiment mode shown in FIG. 1, assuming now that an ON-voltage of a diode is $V_{F(ON)}$, a reverse voltage applied across a diode set under OFF-state is given as flows: $V_{F=Vin−VBE(ON)}−V_{F(ON)}$−Vref. As a consequence, as shown in FIG. 2D and FIG. 2E, an input voltage range may be used up to a reverse withstanding voltage $V_B$. In the conventional differential type comparator (FIG. 5A to FIG. 5C), the input voltage range is restricted by the reverse withstanding voltage $V_R$ of the base-to-emitter voltage $V_{BE}$ of the transistor. In contrast, in the differential type comparator according to this embodiment of the present invention, the input voltage range is restricted by the reverse withstanding voltages $V_B$ of the diodes 3 and 4. For instance, when a Shottky barrier diode having a high reverse withstanding voltage $V_B$ is employed, an input voltage range can be enlarged. Also, a voltage difference between the input signal Vin and the reference voltage Vref may be used up to a minimum voltage value by which the diodes 3 and 4 can be turned ON/OFF.

In the above-described embodiment, both the diodes 3 and 4 are not limited to the Shottky barrier diodes, but any diodes having higher withstanding voltages may be alternatively employed. The current values of the current sources 5 and 7 and the current source 6 may be either different or same. Also, the current-to-voltage converting circuit 10 is constituted by employing the resistors 8 and 9 in the embodiment. Alternatively, any circuit arrangement may be employed as long as these circuit arrangements can convert currents into voltages and output comparison judgement results (H/L). As the transistors 1N and 2N, npn type transistors are employed in this embodiment. Alternatively, pnp type transistors may be employed.

Figure 3:
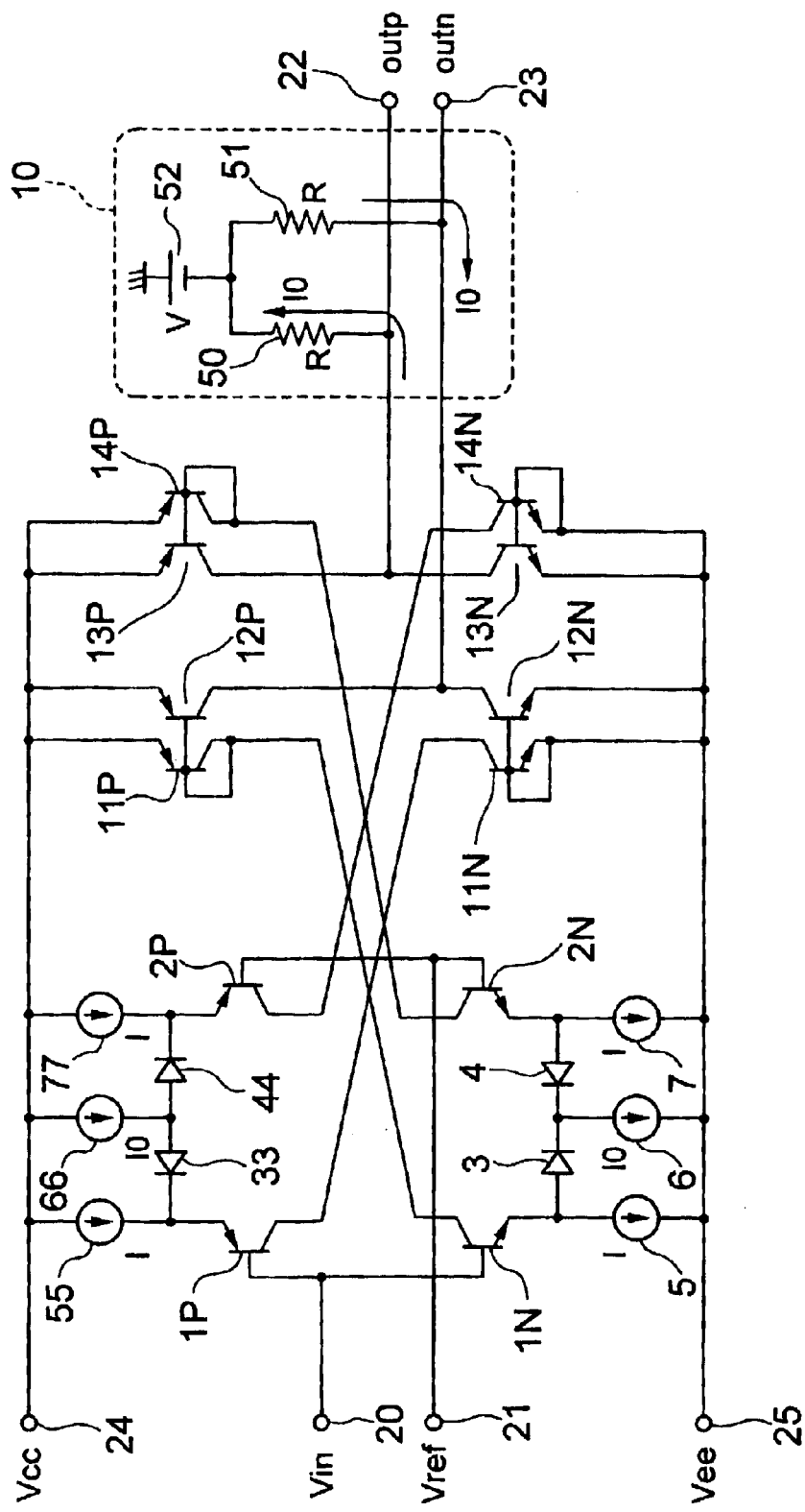
FIG. 3 is a circuit diagram of a comparator circuit according to another embodiment of the present invention.
Figure 4:
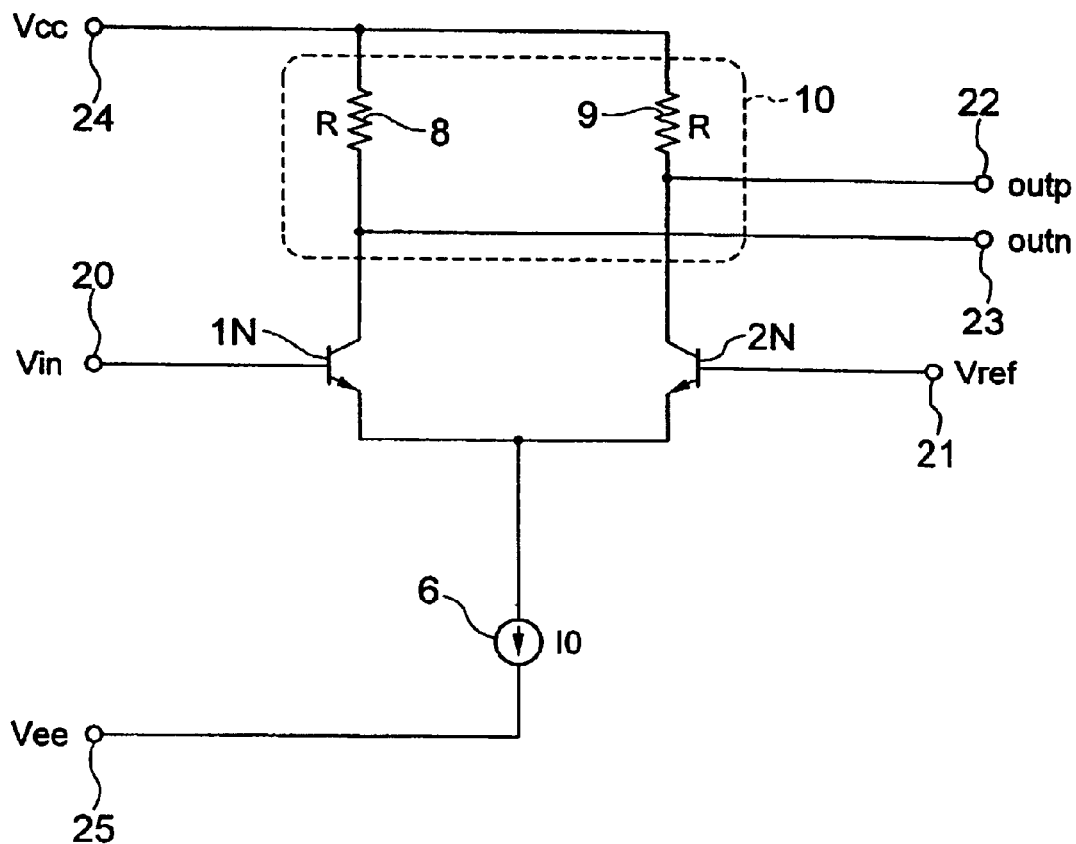
FIG. 4 is the circuit diagram of a conventional comparator circuit.

FIG. 3 is a circuit diagram of a comparator circuit according to another embodiment of the present invention. The comparator circuit of this embodiment is constituted by arranging the differential type amplifier employing the npn type transistors shown in FIG. 1 and another differential amplifier employing pnp type transistors in a symmetric manner, mirror circuits for causing a current to flow into or out of a current-to-voltage converting circuit 10, and the current-to-voltage converting circuit 10.

The current-to-voltage converting circuit 10 is constituted by resistors 50 abd 51, and a voltage source 52. The mirror circuits are constructed of transistors 11N and 12N, transistors 11P and 12P, transistors 13N and 14N, and transistors 13P and 14P, respectively.

For example, in the case that input voltage levels of the input terminals 20 and 21 are input signal Vin 20<reference voltage Vref 21, both the transistors 1P and 2N are turned ON, and both the diodes 4 and 33 are turned ON. A current I+I0 flows through the transistors 11N and 14P, whereas another current I flows through the transistors 11P and 14N. Since the mirror circuits invert the currents, the current I+I0 flows through the transistors 12N and 13P, whereas the current I flows through the transistors 12P and 13N. As a result, only the current I0 may flow through the resistors 50 and 51 of the current-to-voltage converting circuit 10 in a direction illustrated in this drawing, a voltage level of outp=V−I0×R is outputted at the output terminal 22, and a voltage level of outn=V+I0×R is outputted at the output terminal 23. Since the output voltage levels become outp<outn, it is so judged that Vin<Vref. Since the voltage levels of the output terminals 22 and 23 are determined based upon the current value I0 of the current sources 6 and 66, and the resistance values of the resistors 50 and 51, and also, the voltage value of the voltage source 52, these voltage levels are constant values of either high levels (H) or low levels (L).

In the case that the input signal Vin 20>the reference voltage Vref 21, both the transistors 1N and 2P are turned ON, both the diodes 3 and 44 are turned ON, the current path of the current I0 is switched, the current I0 flows in a direction opposite to that shown in FIG. 3, and the voltage levels of the output terminals 22 and 23 become outp>outn.

In such a case that a negative voltage level is wanted to be obtained as the comparison judging levels (H/L) outputted to both the output terminals 22 and 23, when the power supply voltage Vcc of the power supply terminal 24 is a positive voltage in the embodiment of FIG. 1, the current values of the current sources 5, 7 and 6 need to be increased and also the resistance values of the resistors 8 and 9 need to be increased. Otherwise, a circuit for converting a voltage level must be provided at the next stage of the comparator. However, as in the embodiment of FIG. 3, in the case that the differential amplifiers are constituted by employing the npn type transistors and the pnp type transistors in the symmetric manner, the comparison judging levels (H/L) outputted to the output terminals 22 and 23 may be determined based upon the voltage source 52 of the current-to-voltage converting circuit 10. As a result, even if the current flowing through the circuit is not increased, the negative comparison judging level may be obtained by the comparator alone.

In the above-described embodiment, the current-to-voltage converting circuit 10 is constituted by the resistors 50 and 51, and the voltage source 52. Alternatively, any circuit arrangement may be used as the current-to-voltage converting circuit 10 as long as it is capable of converting a current into a voltage and also capable of outputting a comparison judging result (H/L). It should be noted that the current-to-voltage converting circuits 10 are merely indicated as the circuits having the same operations. Therefore, the circuit arrangement of the current-to-voltage converting circuit 10 of the embodiment shown in FIG. 3 cannot be directly applied to the current-to-voltage converting circuit of the previous embodiment shown in FIG. 1.

As to the below-mentioned comparators according to other embodiments, description will be made of such cases using npn type transistors. Alternatively, these comparators may be arranged by employing pnp type transistors, or both npn type transistors and pnp type transistors in a symmetric manner.

Figure 8:
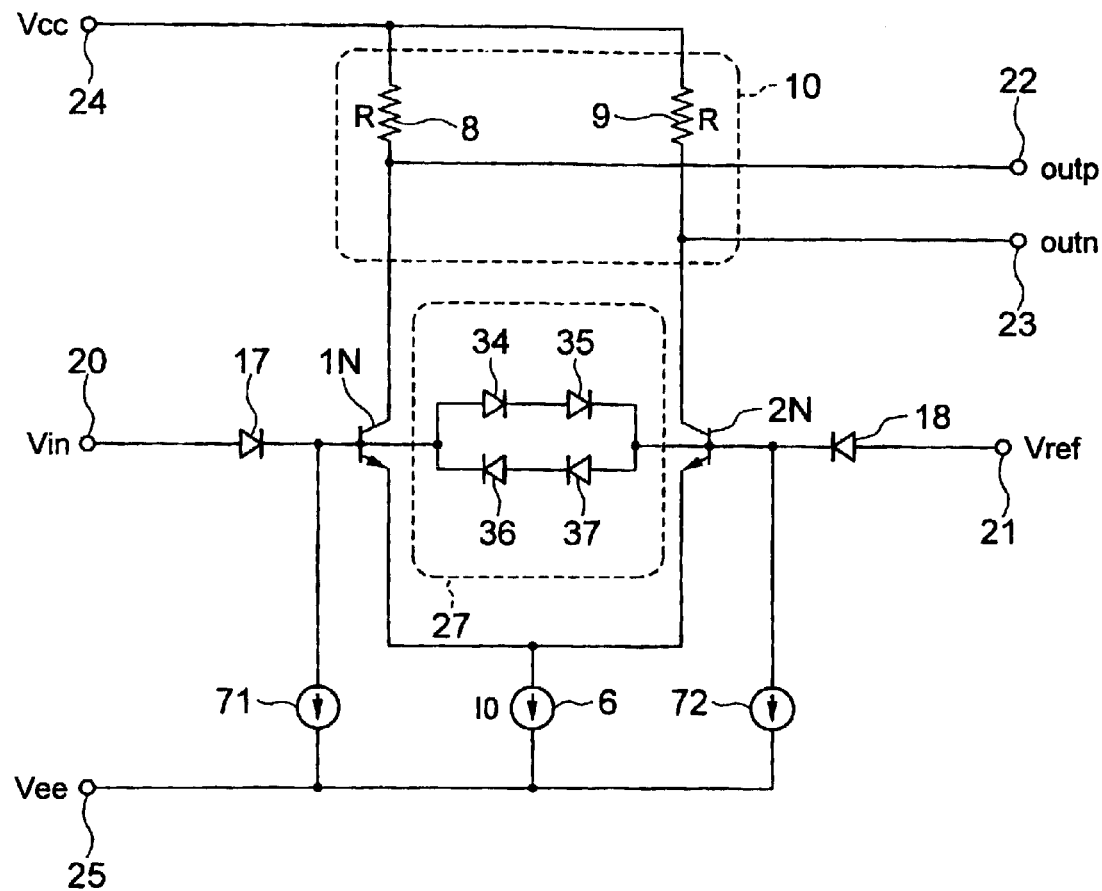
FIG. 8 is a circuit diagram of a comparator circuit according to still another embodiment of the present invention.

FIG. 8 is a circuit diagram of a comparator circuit according to a further embodiment of the present invention. This comparator is constituted by diodes 17 and 18 of the input terminals 20 and 21, current sources 71, 72 and 6, a differential transistor pair 1N and 2N, a circuit 27 connected between the bases of the differential transistor pair, and a current-to-voltage converting circuit 10. The circuit 27 connected between the bases of the transistors 1N and 2N is constituted by diodes 34, 35, 36, and 37. The current-to-voltage converting circuit 10 is constituted by resistors 8 and 9. Assuming now that ON-voltages of the diodes 17 and 18 are $V_{F(ON)}$, a voltage of Vin−$V_{F(ON)}$ is applied to the base of the transistor 1N whereas another voltage of Vref−$V_{F(ON)}$ is supplied to the base of the transistor 2N. For example, in the case that the input voltage levels of the input terminals 20 and 21 are given as input signal Vin 20>reference voltage Vref 21, the transistor 1N is turned ON and the transistor 2N is turned OFF; and assuming now that the ON-voltage between the base and the emitter of the transistor 1N is $V_{BE(ON)}$, the emitter voltage of both the transistors 1N and 2N becomes Vin−$V_{F(ON)}$−$V_{BE(ON)}$. In the circuit 27 connected between the base terminals of the transistors 1N and 2N, both the diodes 34 and 35 are turned ON; both the diodes 36 and 37 are turned OFF; the base voltage of the transistor 2N is determined as Vin−2×$V_{F(ON)}$; and also, such a reverse voltage of Vin−2×$V_{F(ON)}$−Vref is applied to the diode 18. In the conventional differential type comparator (FIG. 5), the input voltage range is limited by the reverse withstanding voltage $V_R$ of the transistor $V_{BE}$. In contrast, in the differential type comparator according to this embodiment of the present invention, the input voltage range is restricted by reverse withstanding voltages $V_B$ of the diodes 17 and 18. For instance, when a Shottky barrier diode having a high reverse withstanding voltage $V_B$ is employed, an input voltage range can be enlarged. Assuming now that the ON-voltages $V_{BE(ON)}$ of the transistors 1N and 2N are equal to the ON-voltage $V_{F(ON)}$ of the diode, the reverse voltage Of $V_{F(ON)}$ is applied to the base-to-emitter voltage $V_{BE}$ of the transistor 2N, and thus, the reverse voltage of $V_{BE}$ of the transistor 2N can be maintained within the base-emitter reverse withstanding voltage $V_R$, SO that the comparator circuit is not operated under erroneous condition. Also, a voltage difference between the input signal Vin and the reference voltage Vref may be used up to a minimum voltage value by which the transistors 1N and 2N can be turned ON/OFF.

Figure 9:
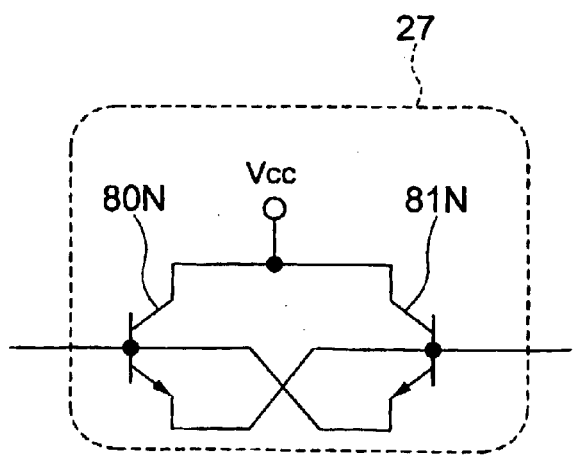
FIG. 9 is a diagram for indicating another circuit arrangement example of a part of the circuit of FIG. 8.

The circuit 27 connected between the base terminals of the transistors 1N and 2N may be alternatively arranged by employing such transistors as shown in FIG. 9. In the case that this circuit 27 is arranged by employing the diodes as indicated in the above-described embodiment, a current flows in the direction from the input signal Vin 20 to the reference voltage Vref 21, or in the direction from the reference voltage Vref 21 to the input signal Vin 20. In order that this current does not flow, as shown in FIG. 9, the circuit 27 may be constituted by using the transistors. It should also be understood that this circuit 27 owns the following purpose. That is, when a reverse voltage is applied between the bases and the emitters of the differential transistors 1N and 2N, the circuit 27 restricts the reverse voltage so that the reverse voltage may not exceed the reverse withstanding voltages $V_R$ of the bases-emitters of the transistors 1N and 2N, while the input voltage range of the comparator circuit can be enlarged by the reverse withstanding voltages $V_B$ of the diodes 17 and 18. Therefore, the circuit 27 is not limited to the circuit arrangements of the embodiment modes shown in FIG. 8 and FIG. 9. Also, both the diodes 17 and 18 are not limited only to the Shottky barrier diodes, but any diodes that have high withstanding voltages may be alternatively employed.

Figure 10:
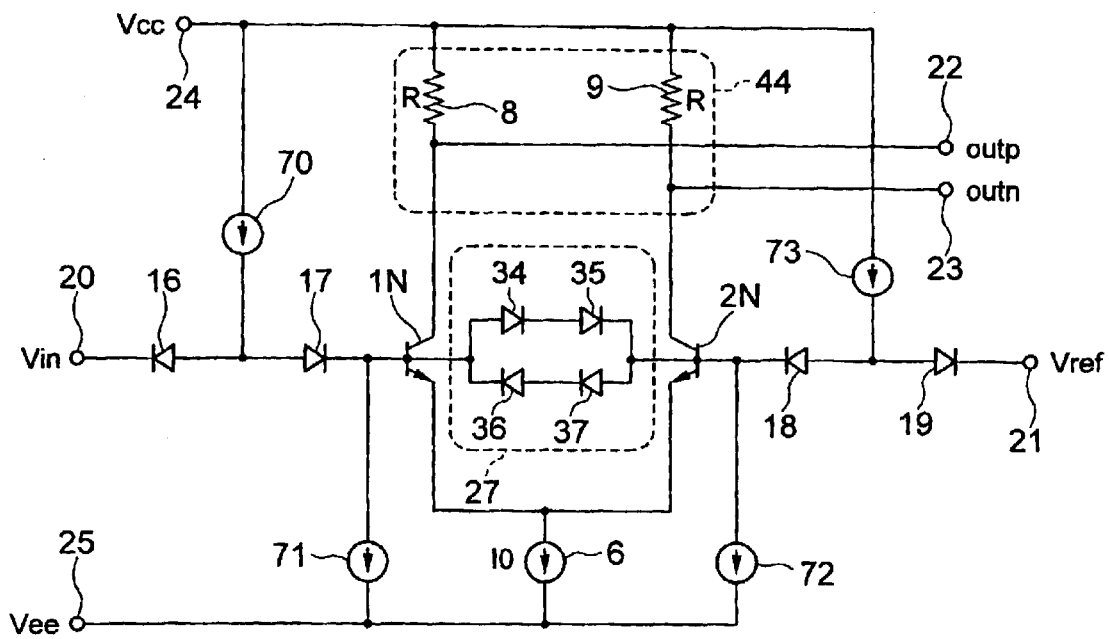
FIG. 10 is a circuit diagram of a comparator circuit according to a further embodiment of the present invention.

FIG. 10 is a circuit diagram of a comparator circuit according to a further embodiment of the present invention. This comparator circuit is arranged by adding diodes 16 and 19, and current sources 70 and 73 to the above-described comparator circuit shown in FIG. 9. As a result, the same voltages as the input signal Vin and the reference voltage Vref can be inputted to the bases of the transistors 1N and 2N, and the comparison judgement can be carried out by the same voltages as the input signal Vin and the reference voltage Vref. Also, while the current source 6 is constituted by employing a transistor, a voltage $V_{CE}$ between an emitter and a collector of this transistor becomes high by the ON-voltages $V_{F(ON)}$ of the diodes 16 and 19, as compared with the embodiment of FIG. 9. As a consequence, in particular, when the transistor for constituting the current source 6 is in a saturation region, it is effective to add both the diodes 16 and 19 to the input terminal. Operations of this comparator circuit are similar to those of the embodiment shown in FIG. 9. It should be understood that both the current sources 70 and 73 are to turn ON the diodes 16 and 19, and, the positions of the current sources are not limited only to those of this embodiment. Also, the number of these diodes used is not limited to that used in this embodiment.

Figure 11:
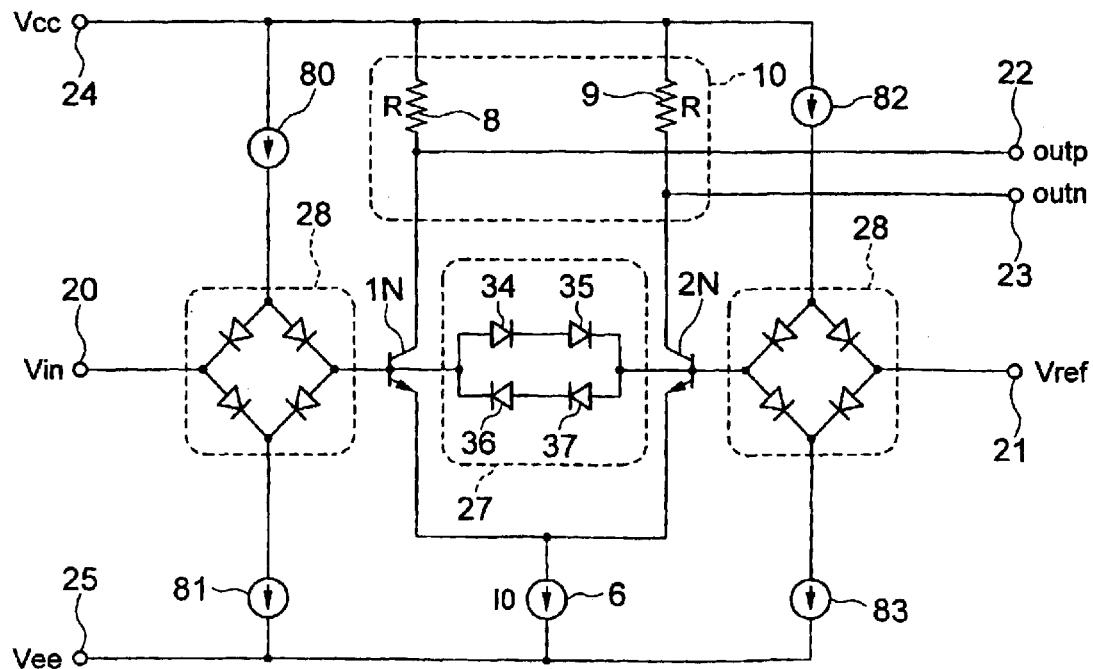
FIG. 11 is a circuit diagram of a comparator circuit according to a still further embodiment of the present invention.

FIG. 11 is a circuit diagram of a comparator circuit according to a further embodiment of the present invention. This comparator circuit is arranged such that the diodes 17 and 18 of the previous embodiment shown in FIG. 9 are constituted by diode bridge circuits 28, and current sources 80, 81, 82, and 83 are added to drive this diode bridge circuits 28. As a consequence, the same voltages as the input signal Vin and the comparison voltage Vref can be inputted to the bases of the transistors 1N and 2N, and the comparison judgement can be carried out by the same voltages as the input signal Vin and the reference voltage Vref.

By arranging the diode bridge circuits 28 such that the currents of the current sources 80, 81, 82 and 83 do not flow, the diode bridge circuits 28 may be utilized as switches capable of separating the inputs of the input signal Vin 20 and the reference voltage Vref 21 from the comparator circuit.

Figure 16:
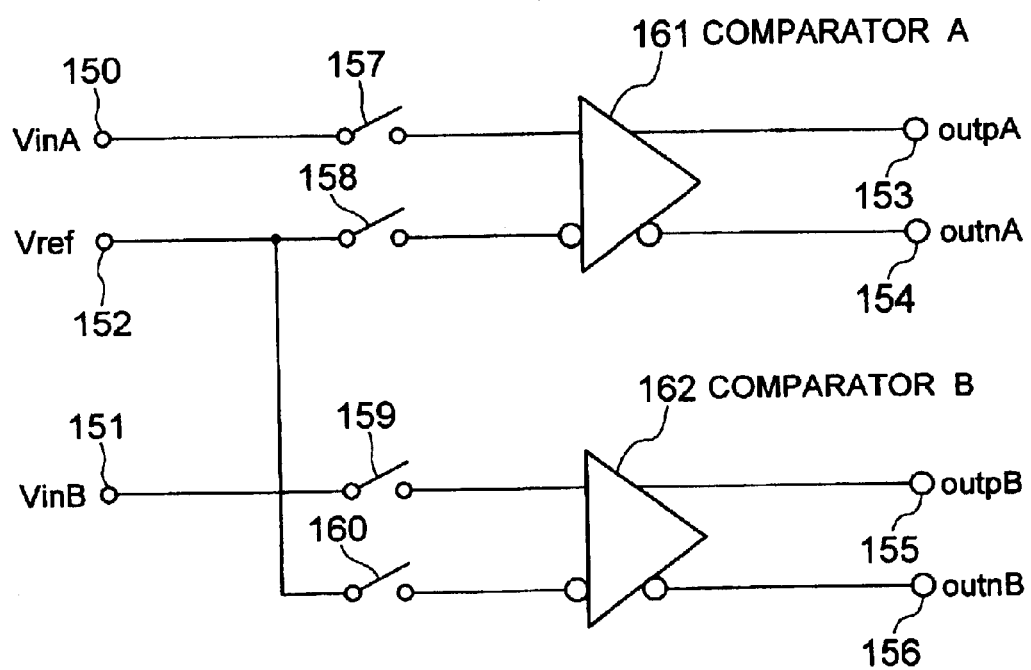
FIG. 16 is a diagram for explaining one embodiment using the comparator circuit of FIG. 11.

FIG. 16 is a diagram for explaining one embodiment in which the diode bridge circuits 28 of FIG. 11 are employed as switches. In such a case that input signals are such two inputs as VinA(150) and VinB(150), it is so assumed that comparator circuits corresponding to the respective input signals are A(161) and B(162). Switches 157 to 160 represent equivalents of the diode bridge circuits of the embodiment shown in FIG. 11. With the arrangement thus shown, there are two sorts of input signals and any one of these two input signals may be selected so as to be compared/judged relative to a reference voltage Vref 152. At this time, by turning ON/OFF the switch utilizing the diode bridge circuit, the selected input signal may be inputted only to any one of these two comparators A(161) and B(162). As a result, power consumption of the circuit can be suppressed, as compared with such a case that the two input signals are continuously compared/judged. It should be noted that the comparator circuits shown in FIG. 16 represent such a circuit portion of the embodiment shown in FIG. 11 except for the diode bridge circuits 28. Also, the switches 157 to 160 equivalently representing the diode bridge circuits are employed not only as the switches, but also to achieve that the input voltage range of the comparator may be enlarged.

Figure 12:
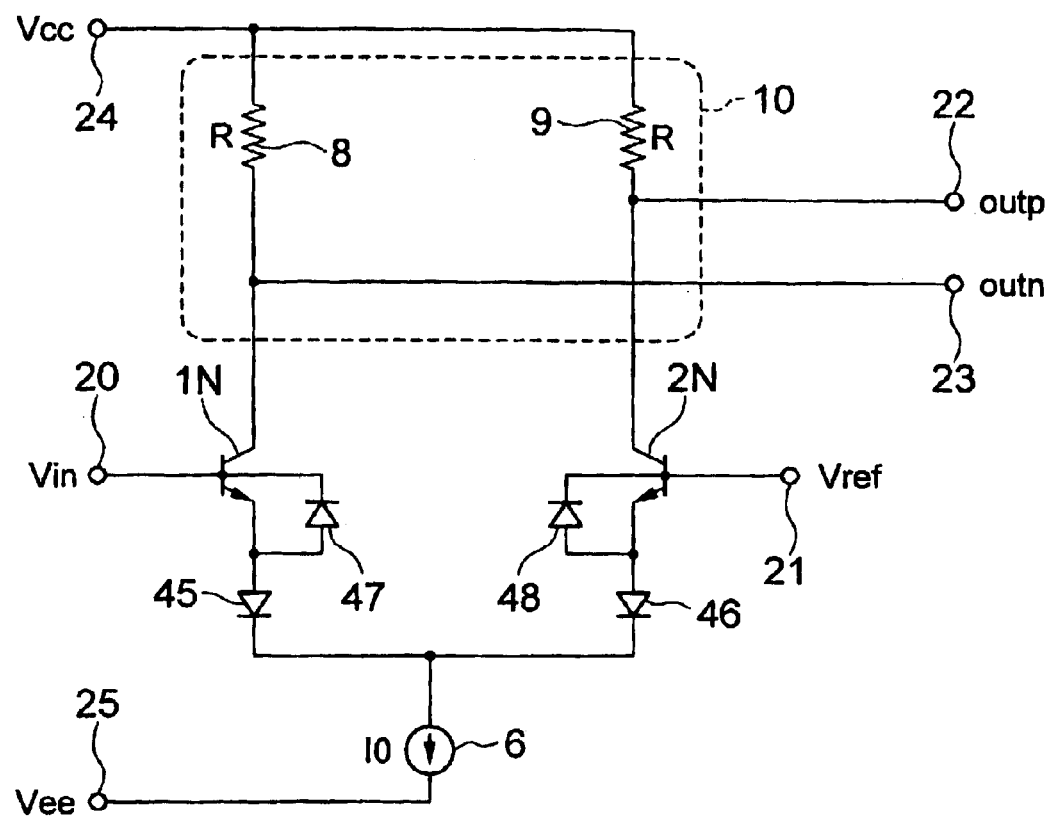
FIG. 12 is a circuit diagram of a comparator circuit according to a still further embodiment of the present invention.

FIG. 12 is a circuit diagram of a comparator circuit according to a further embodiment of the present invention. This comparator circuit is arranged by differential-paired transistors 1N and 2N, diodes 45 and 46 connected to emitter terminals of the differential transistor pair, and diodes 47 and 48 connected between bases and emitters of this differential transistor pair. For instance, in the case that the input voltage levels of the input terminals 20 and 21 are given as input signal Vin 20>reference voltage Vref 21, both the diode 45 and the transistor 1N are turned ON and the transistor 2N and the diode 46 are turned OFF, and a voltage of a cathode common terminal of the diodes 45 and 46 becomes Vin−$V_{BE(ON)}$−$V_{F(ON)}$. Since both the diodes 47 and 48 are continuously set to OFF-states, an emitter voltage of the transistor 2N is substantially equal to the reference voltage Vref. In the conventional differential type comparator (FIG. 5), the input voltage range is restricted by the reverse withstanding voltage of the base-to-emitter voltage $V_{BE}$ of the transistor. In contrast, in this embodiment of the present invention, the input voltage range is limited by the reverse withstanding voltages $V_B$ of the diodes 45 and 46. For instance, when a Shottky barrier diode having a higher reverse withstanding voltage $V_B$ is employed, the input voltage range may be enlarged. Also, a voltage difference between the input signal Vin and the reference voltage Vref may be used up to a minimum voltage value by which the transistors 1N and 2N can be turned ON/OFF.

Figure 13:
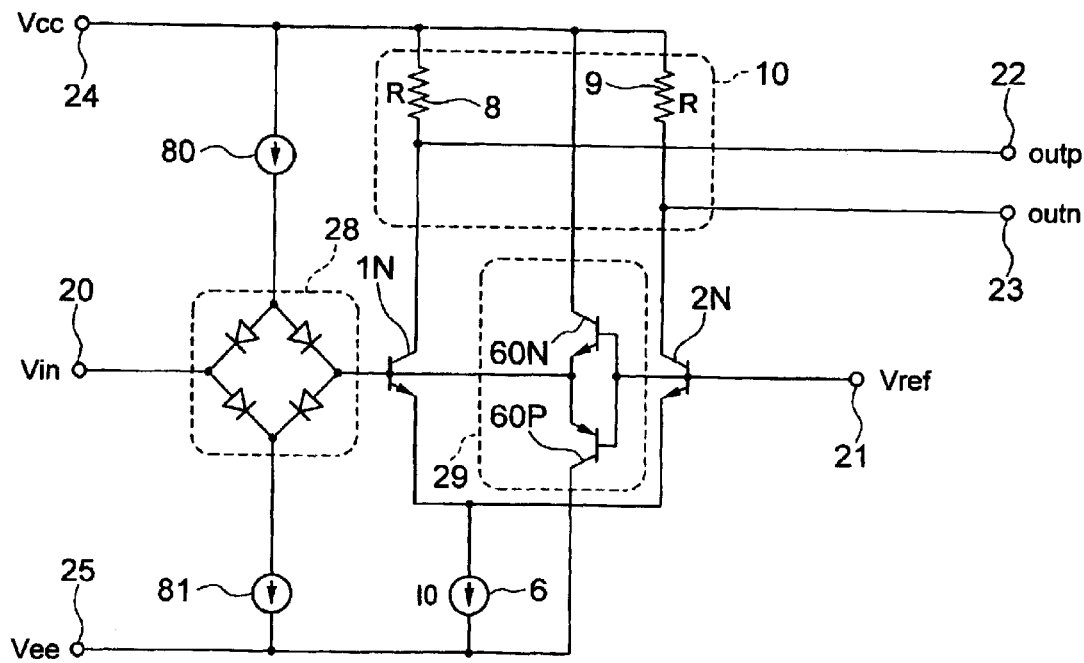
FIG. 13 is a circuit diagram of a comparator circuit according to a still further embodiment of the present invention.

FIG. 13 is a circuit diagram of a comparator circuit according to a further embodiment of the present invention. This comparator circuit is constituted by differential-paired transistors 1N and 2N, a diode bridge circuit 28, a current source 6, and a circuit 29 connected between base terminals of the differential-paired transistors. This circuit 29 is constructed by connecting an NPN type transistor 60N and a PNP type transistor 60P in a push-pull structure. The same voltage as the input signal Vin is applied to the base of the transistor 1N, and also the reference voltage Vref is applied to the base of the transistor 2N by way of the diode bridge circuit 28.

For example, in the case that the input voltage levels of the input terminals 20 and 21 are given as input signal Vin 20>reference voltage Vref 21, the transistor 1N is turned ON and the transistor 2N is turned OFF; and assuming now that the ON-voltage between the base and the emitter of the transistor 1N is equal to $V_{BE1N(ON)}$, the emitter voltage of both the transistors 1N and 2N becomes Vin−$V_{BE1N(ON)}$. In the circuit 29 connected between the base terminals of the transistors 1N and 2N, the transistor 60N is turned OFF, and the transistor 60P is turned ON. At this time, a current supplied from the current source 80 passes through the base of the transistor 1N and then flows into the transistor 60P, and assuming now that the ON-voltage between the base and the emitter of the transistor 60P is $V_{BE60P(ON)}$, the base potentials of the transistors 2N, 60N, and 60P become Vin−$V_{BE60P(ON)}$. As a result, a voltage of $V_{BE}=V_{BE60P(ON)}-V_{BE1N(ON)}$ is applied across the base and the emitter of the transistor 2N, and can be maintained within the reverse withstanding voltage $V_R$-range, so that the input voltage range can be enlarged. Also, a voltage difference between the input signal Vin and the reference voltage Vref may be used up to a minimum voltage value by which the transistors 1N and 2N can be turned ON/OFF.

It should also be noted that the diode bridge circuit 28 need not be provided on the side of the input signal Vin, but may be provided on the side of the reference voltage Vref. In this alternative case, the connections of the circuit 29 arranged between the base terminals of the differential-paired transistors 1N and 2N must be also reversed in terms of signal connection.

Figure 14:
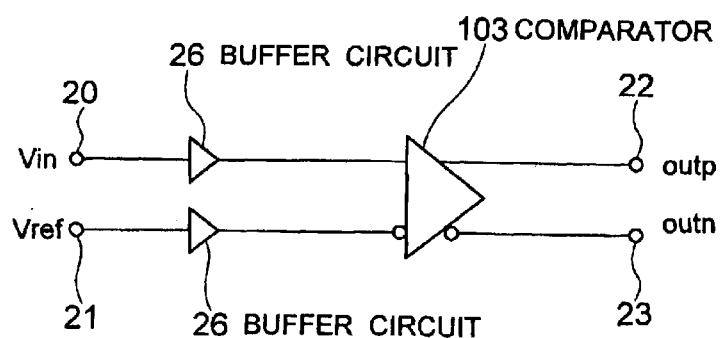
FIG. 14 is a diagram for showing an arrangement of a comparator circuit according to a still further embodiment of the present invention.
Figure 15:
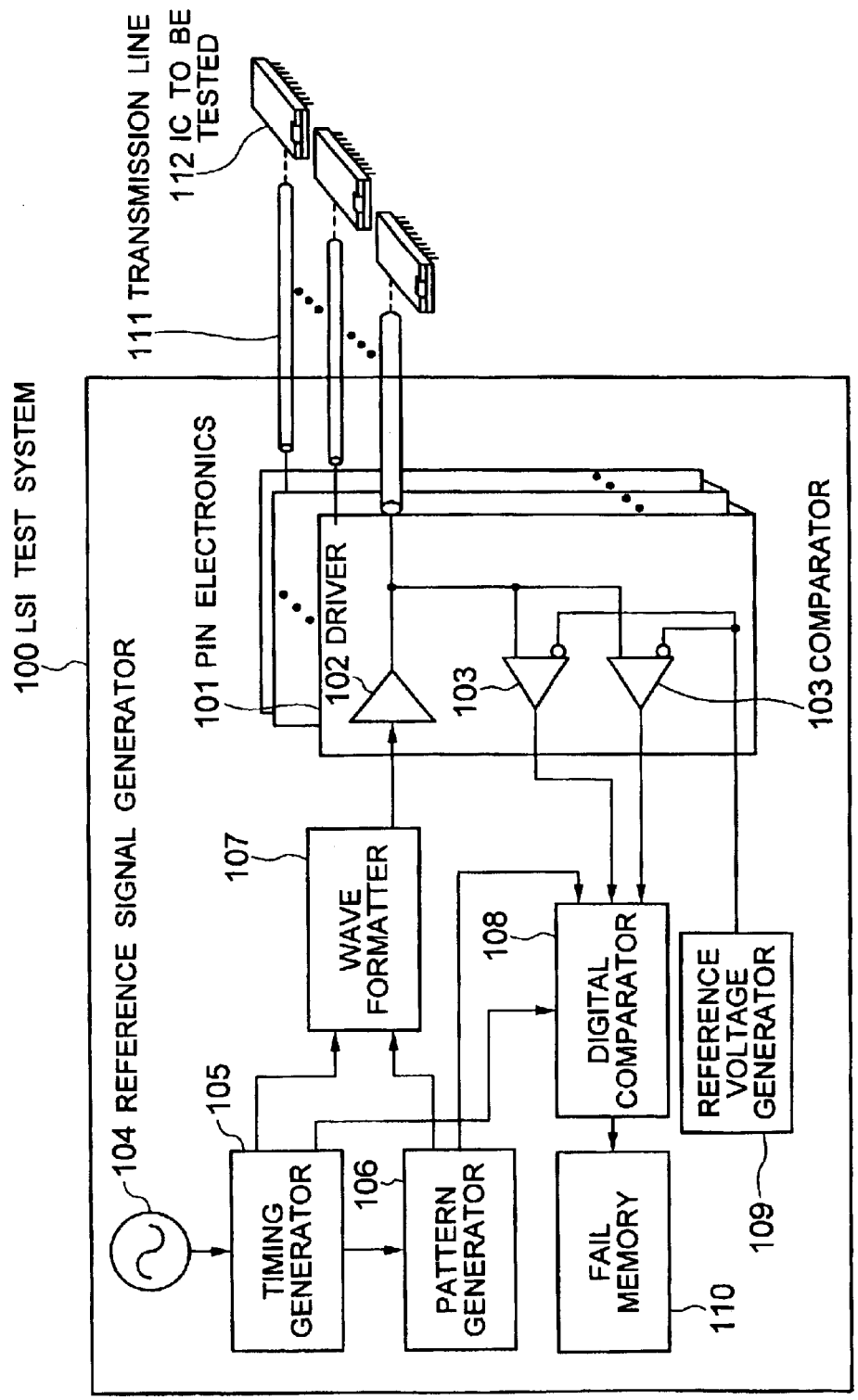
FIG. 15 is a schematic diagram for indicating an arrangement of a LSI test system.

FIG. 14 is a circuit diagram of a comparator circuit according to a still further embodiment of the present invention. This comparator circuit is constituted by adding a buffer circuit 26 to the comparator circuit 103 of the above-explained embodiment. Both the input signal Vin and the reference voltage Vref are inputted via the buffer circuits 26 to the comparator 103. The buffer circuits 26 are used to, for example, convert an impedance of the comparator 103. In the case that the input impedance of this comparator 103 is desired to be a high impedance, for example, such an emitter follower circuit having a high input impedance and a low output impedance may be employed as this buffer circuit 26. It should be understood that there is no specific restriction in the circuit arrangement of the buffer circuit 26.

In this embodiment, the comparator circuit 103 and the buffer circuit 26 are separately illustrated. However, this does not mean that the comparator 103 and the buffer circuit 26 must be separately provided. As far as the effect of individual embodiment can be achieved, the buffer circuit 26 may be either contained in the comparator 103 or separately employed with respect to the comparator 103.

Next, description will now be made of a LSI test system 100 with employment of the comparator which has been explained in the above-described embodiments. The LSI test system 100 is a LSI test system for testing a basic operation and a function of an IC (semiconductor integrated circuit). This LSI test system 100 applies a test waveform to an IC 112 to be tested, and compares and pass/fail judges a response waveform returned from the IC 112 to be tested with a previously-prepared expectation value so as to perform an operation test of this IC 112 to be tested.

More specifically, a timing generator 105 generates a cycle clock for determining a test cycle, and edge clocks by using an original oscillation clock supplied from a reference signal generator 104. These edge clocks are used to determine both the timing of an application test signal and the judging timing (timing of rising edge/falling edge) of a response signal. These edge clocks are supplied via a delay circuit (not shown) for adjusting a phase shift among the edge clocks to both a wave formatter 107 and a digital comparator 108. The pattern generator 106 generates test pattern data which contains information on test waveforms and expectation values. The waveform formatter 107 receives the timing edges of the test waveform, which indicate both the rising/falling edge timing of the test waveform from the timing generator 105, and also receives the test pattern data generated from the pattern generator 106 so as to form a reference waveform for the test waveform, and then outputs this reference waveform as the test waveform to a driver 102. In order that the reference waveform of the test waveform outputted from the wave formatter 107 may be matched with the signal level of the IC 112 to be tested, the driver 102 adjusts the reference voltage and an amplitude of the reference waveform, and then applies the adjusted reference waveform to the IC 112 to be tested. In the comparator 103, the response signal is made to match the signal level of the comparing/judging circuit by using a reference voltage applied from a reference voltage generator 109 in order to judge a logic value voltage (H/L) of the response waveform returned from the IC 112 to be tested. Then, if a predetermined voltage value can be satisfied by the logic value voltage (L/H), then the digital comparator 108 compares the response waveform with the expectation value sent from the pattern generator 106 so as to perform the judgement. In this case, in such a case that the response result is not matched with the expectation value, the LSI test system 100 judges that this IC 112 to be tested is a failure IC, and writes a failure judgement result into a fail memory.

It should also be understood that the above explanation has made with respect to the case in which the comparator disclosed in the present invention is applied to the LSI test system. However, this comparator is not always limited to be used in the LSI test system. Apparently, the comparator according to the present invention may be applied to another comparator used in other technical fields.

The typical comparators disclosed in the above-described embodiments are as follows:

The comparator which is comprised of a transistor pair which is continuously in ON state, switch means constructed of diodes, and a current-to-voltage converting circuit. Since the transistor pair is continuously in ON state, no reverse voltage is applied across the bases and the emitters thereof. The input voltage range of this comparator is determined based upon the reverse withstanding voltage of the diodes of the switch means. For instance, if a shottky barrier diode having such a withstanding voltage higher than, or equal to 10V is used, then even when a difference between the input signal Vin and the reference voltage Vref is higher than, or equal to 10V, these input signal and reference voltage can be correctly compared/judged. Also, the voltage difference between the input signal Vin and the reference voltage Vref may be used up to the minimum voltage value by which the diode can be turned ON/OFF.

The comparator which is provided with: a circuit constituted by either a diode of an input terminal or plural diodes; a differential transistor pair in which the transistors are turned ON/OFF in response to the high/low relationship between the voltage level of the input signal and the voltage level of a reference voltage; a circuit constituted by diodes or transistors between the base terminals of the differential transistor pair; and a voltage-to-current converting circuit. The reverse voltage applied across the base and the emitter of the transistor placed under OFF state in the differential transistor pair does not exceed the reverse withstanding voltage by the circuit provided between the bases of the differential transistor pair. The input voltage range of this comparator is determined based upon the reverse withstanding voltage of the diode of the input terminal. For instance, if a shottky barrier diode having such a withstanding voltage higher than, or equal to 10V is used, then even when a difference between the input signal Vin and the reference voltage Vref is higher than, or equal to 10V, these input signal and reference voltage can be correctly compared/judged. Also, the voltage difference between the input signal Vin and the reference voltage Vref may be used up to the minimum voltage value by which the diode can be turned ON/OFF.

The comparator which is provided with: a differential transistor pair in which each transistor is turned ON/OFF in response to a high/low relationship between the voltage level of an input signal and the voltage level of a reference voltage; diodes each provided at the emitter terminals of the differential transistor pairs and across the emitter and the base thereof; and means for converting the current which is switched by the differential transistor pair into the voltage level. The reverse voltage applied across the bases and the emitters of the transistor pair does not exceed the reverse withstanding voltage by the diode connected across the bases and the emitters of the transistor pair. The input voltage range of this comparator is determined based upon the reverse withstanding voltage of the diode of the emitter terminals of the differential transistor pair. For instance, if a shottky barrier diode having such a withstanding voltage higher than, or equal to 10V is used, then even when a difference between the input signal Vin and the reference voltage Vref is higher than, or equal to 10V, these input signal and reference voltage can be correctly compared/judged. Also, the voltage difference between the input signal Vin and the reference voltage Vref may be used up to the minimum voltage value by which the diode can be turned ON/OFF.

The comparator which is comprised of: a diode bridge circuit provided at one input terminal; a differential transistor pair in which the transistors are turned ON/OFF in response to a high/low relationship between the voltage level of an input signal and the voltage level of a reference voltage; a push-pull circuit provided between the base terminals of the differential transistor pair; and means for converting the current which is switched by the differential transistor pair into a voltage level. The reverse voltage applied across the bases and the emitters of the transistors does not exceed the reverse withstanding voltage by way of the diode bridge circuit and the push-pull circuit provided between the base terminals of the transistor pair. As a consequence, the input voltage range can be used up to such a voltage approximated to the power supply voltage. Also, the voltage difference between the input signal Vin and the reference voltage Vref may be used up to the minimum voltage value by which the diode can be turned ON/OFF.

While the present invention has been concretely described based upon the various embodiments invented by the inventors of the present invention, the present invention is not limited to the above-explained embodiments and various changes and modifications may be made without departing from the spirit and scope of the appended claims.

The effects which can be achieved by the typical comparators/LSI test system among the comparators/LSI test system disclosed in the present invention will now be briefly explained:

(1) By using the reverse withstanding voltage (reverse voltage application range) of a diode, the input voltage range can be enlarged with employment of a simple circuit arrangement.

(2) The comparator having no frequency range limitation of the input analog signal can be provided.

(3) The comparator which is particularly suitable for the LSI test systems can be provided.

What is claimed is:

1. A comparator comprising:
    a diode provided at an input terminal;
    a differential transistor pair including transistors, said transistors being turned ON/OFF in response to a high/low relationship between a voltage level of an input signal and a voltage level of a reference voltage;
    a circuit constituted by diodes between base terminals of said differential transistor pair; and
    means for converting a current which is switched by said differential transistor pair into a voltage level.

2. A comparator as claimed in claim 1 wherein said circuit between the base terminals of said differential transistor pair is constituted by transistors.

3. A comparator as claimed in claim 1 wherein said diode at said input terminal includes a plurality of diodes.

4. A comparator as claimed in claim 1 wherein said diode at the input terminal is constituted by a diode bridge.

5. A comparator comprising:
    a differential transistor pair including transistors, said transistors being turned ON/OFF in response to a high/low relationship between a voltage level of an input signal and a voltage level of a reference voltage;
    diodes provided at emitter terminals and diodes provided across emitters and bases of said differential transistor pairs; and
    means for converting a current which is switched by said differential transistor pair into a voltage level.

6. A comparator comprising:
    a diode bridge circuit provided at one of input terminals;
    a differential transistor pair including transistors, said transistors being turned ON/OFF in response to a high/low relationship between a voltage level of an input signal and a voltage level of a reference voltage;
    a push-pull circuit provided between base terminals of said differential transistor pair; and
    means for converting a current which is switched by said differential transistor pair into a voltage level.

7. A comparator as claimed in claim 1 wherein a buffer circuit is provided at a prestage of said comparator.

8. An integrated circuit wherein the comparator recited in claim 1 is used in comparing means for comparing two voltage levels.

9. A comparator according to claim 5, wherein a buffer circuit is provided at a prestage of said comparator.

10. A comparator according to claim 6, wherein a buffer circuit is provided at a prestage of said comparator.

11. An integrated circuit wherein the comparator recited in claim 5 is used in comparing means for comparing two voltage levels.

12. An integrated circuit wherein the comparator recited in claim 6 is used in comparing means for comparing two voltage levels.

13. An LSI test system comprising:
    a driver which applies a signal to a to-be-tested object; and
    a comparator which receives an output of said to-be-tested object and compares said output of said to-be-tested object with a reference signal,
    wherein the comparator according to claim 1 is used as said comparator.

14. An LSI test system comprising:

a driver which applies a signal to a to-be-tested object; and a comparator which receives an output of said to-be-tested object and compares said output of said to-be-tested object with a reference signal, wherein the comparator according to claim 2 is used as said comparator.

15. An LSI test system comprising:

a driver which applies a signal to a to-be-tested object; and a comparator which receives an output of said to-be-tested object and compares said output of said to-be-tested object with a reference signal, wherein the comparator according to claim 3 used as said comparator.

16. An LSI test system comprising:

a driver which applies a signal to a to-be-tested object; and a comparator which receives an output of said to-be-tested object and compares said output of said to-be-tested object with a reference signal, wherein the comparator according to claim 4 is used as said comparator.

17. An LSI test system comprising:

a driver which applies a signal to a to-be-tested object; and a comparator which receives an output of said to-be-tested object and compares said output of said to-be-tested object with a reference signal, wherein the comparator according to claim 5 is used as said comparator.

18. An LSI test system comprising:

a driver which applies a signal to a to-be-tested object; and a comparator which receives an output of said to-be-tested object and compares said output of said to-be-tested object with a reference signal, wherein the comparator according to claim 6 is used as said comparator.

* * * * *